(12) United States Patent
Jun et al.

(10) Patent No.: US 9,992,864 B2
(45) Date of Patent: *Jun. 5, 2018

(54) COMPOSITION FOR FORMING CONDUCTIVE PATTERN, METHOD FOR FORMING CONDUCTIVE PATTERN USING THE SAME, AND RESIN COMPONENTS HAVING CONDUCTIVE PATTERN THEREON

(71) Applicant: LG CHEM, LTD., Seoul (KR)

(72) Inventors: Shin Hee Jun, Daejeon (KR); Jae Hyun Kim, Daejeon (KR); Cheol-Hee Park, Daejeon (KR); Chee-Sung Park, Daejeon (KR); Jae Jin Kim, Daejeon (KR); Han Nah Jeong, Daejeon (KR); Eun Kyu Seong, Daejeon (KR); Su Jeong Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 273 days.

This patent is subject to a terminal disclaimer.

(21) Appl. No.: 14/912,005

(22) PCT Filed: Apr. 16, 2015

(86) PCT No.: PCT/KR2015/003850
§ 371 (c)(1),
(2) Date: Feb. 12, 2016

(87) PCT Pub. No.: WO2015/160209
PCT Pub. Date: Oct. 22, 2015

(65) Prior Publication Data
US 2016/0198569 A1    Jul. 7, 2016

(30) Foreign Application Priority Data

Apr. 16, 2014 (KR) .................. 10-2014-0045551

(51) Int. Cl.
| | |
|---|---|
| *C08G 63/02* | (2006.01) |
| *H05K 1/02* | (2006.01) |
| *C09D 5/24* | (2006.01) |
| *H05K 1/03* | (2006.01) |
| *H05K 3/18* | (2006.01) |
| *C23C 18/16* | (2006.01) |
| *C23C 18/20* | (2006.01) |
| *C23C 18/40* | (2006.01) |

(52) U.S. Cl.
CPC ............ *H05K 1/0296* (2013.01); *C09D 5/24* (2013.01); *C23C 18/1608* (2013.01); *C23C 18/1612* (2013.01); *C23C 18/1641* (2013.01); *C23C 18/204* (2013.01); *H05K 1/0373* (2013.01); *H05K 3/181* (2013.01); *C23C 18/405* (2013.01)

(58) Field of Classification Search
CPC ...................................................... C09D 5/24

USPC ................................................. 428/411, 412
See application file for complete search history.

(56) References Cited

U.S. PATENT DOCUMENTS

| 6,207,344 B1 | 3/2001 | Ramlow et al. |
|---|---|---|
| 6,806,034 B1 | 10/2004 | Guggemos et al. |
| 7,060,421 B2 | 6/2006 | Naundorf et al. |
| 7,105,223 B2 | 9/2006 | Kliesch et al. |
| 8,309,640 B2 | 11/2012 | Li et al. |
| 8,865,821 B2 | 10/2014 | Stoppelmann et al. |
| 9,668,342 B2 * | 5/2017 | Jun ................. H05K 1/092 |
| 9,756,725 B2 * | 9/2017 | Jun ................. H05K 1/0326 |
| 2004/0241422 A1 | 12/2004 | Naundorf et al. |
| 2005/0163987 A1 | 7/2005 | Kliesch et al. |
| 2011/0251326 A1 | 10/2011 | Van Hartingsveldt et al. |
| 2011/0281135 A1 | 11/2011 | Gong et al. |
| 2012/0276390 A1 | 11/2012 | Ji et al. |
| 2012/0279764 A1 | 11/2012 | Jiang et al. |

(Continued)

FOREIGN PATENT DOCUMENTS

| CN | 1373817 A | 10/2002 |
|---|---|---|
| CN | 103491716 A | 1/2014 |
| EP | 1734071 A1 | 12/2006 |

(Continued)

OTHER PUBLICATIONS

Anonymous, "Inorganic Pigments for Paints and Plastics—Pigments for Plastics and Paints Inorganic Pigments for Colouration of Paints and Plastics," Ferro GmbH pp. 1-7 (2012).

*Primary Examiner* — Terressa Boykin
(74) *Attorney, Agent, or Firm* — Dentons US LLP

(57) ABSTRACT

The present invention relates to a composition for forming a conductive pattern capable of forming a fine conductive pattern reducing degradation of mechanical physical properties and having excellent adhesion strength, on a polymeric resin product or resin layer, a method for forming a conductive pattern using the same, and a resin component having the conductive pattern. The composition for forming a conductive pattern includes: a polycarbonate-based resin; and particles of a non-conductive metal compound including a first metal and a second metal and having a spinel structure, wherein the particles have a particle diameter of 0.1 to 6 μm; wherein a metal nuclei including the first metal, the second metal, or an ion thereof is formed from the particles of the non-conductive metal compound by electromagnetic wave irradiation. The non-conductive metal compound may have an average specific surface area of about 0.5 to 10 m²/g, preferably about 0.5 to 8 m²/g, more preferably about 0.7 to about 3 m²/g.

15 Claims, 2 Drawing Sheets

(56) References Cited

U.S. PATENT DOCUMENTS

2012/0329922 A1   12/2012  Schrauwen
2014/0248564 A1    9/2014  Schrauwen

FOREIGN PATENT DOCUMENTS

| | | |
|---|---|---|
| EP | 2604648 A1 | 6/2013 |
| JP | 2003510416 A | 3/2003 |
| JP | 2004534408 A | 11/2004 |
| JP | 2006-348298 A | 12/2006 |
| JP | 3881338 B2 | 2/2007 |
| JP | 2008-140972 A | 6/2008 |
| JP | 2010536947 A | 12/2010 |
| JP | 2013515118 A | 5/2013 |
| KR | 10-2001-0051916 A | 6/2001 |
| KR | 10-2005-0030161 A | 3/2005 |
| KR | 10-2005-0077281 A | 8/2005 |
| KR | 10-0716486 B1 | 5/2007 |
| KR | 10-2011-0018319 A | 2/2011 |
| KR | 10-2011-0076496 A | 7/2011 |
| KR | 10-1049219 B1 | 7/2011 |
| KR | 10-2011-0112860 A | 10/2011 |
| KR | 10-2012-0124167 A | 11/2012 |
| KR | 10-2012-0139680 A | 12/2012 |
| KR | 10-2013-0036964 A | 4/2013 |
| KR | 10-2013-0124489 A | 11/2013 |
| KR | 10-2014-0009985 A | 1/2014 |
| KR | 10-2015-0035410 A | 4/2015 |
| TW | 201408727 A | 3/2014 |
| WO | 2001023189 A1 | 4/2001 |
| WO | 2011076729 A1 | 6/2011 |
| WO | 2014106831 A1 | 7/2014 |
| WO | 2014115092 A1 | 7/2014 |

\* cited by examiner

[FIG. 1]
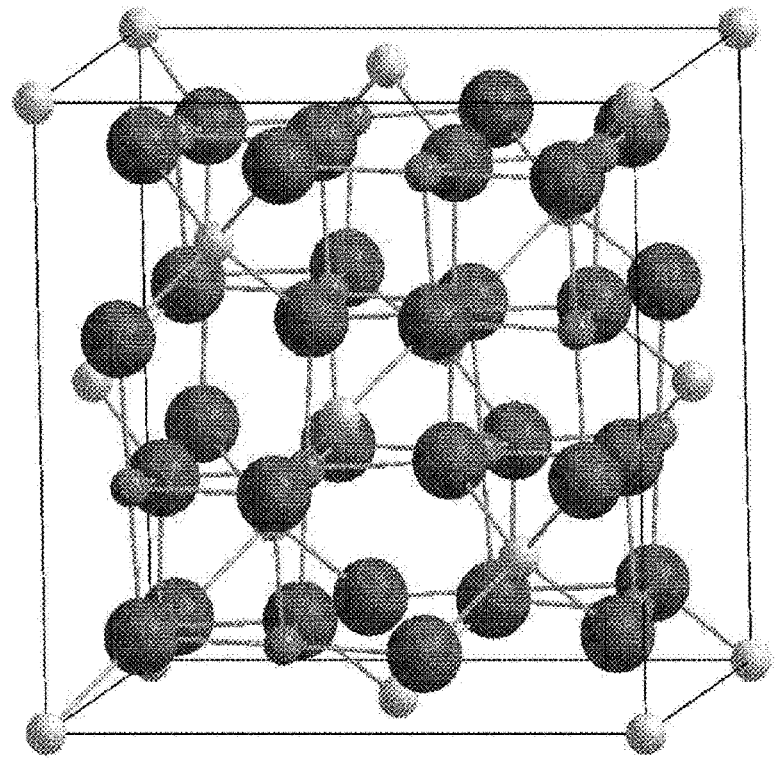
[FIG. 2]
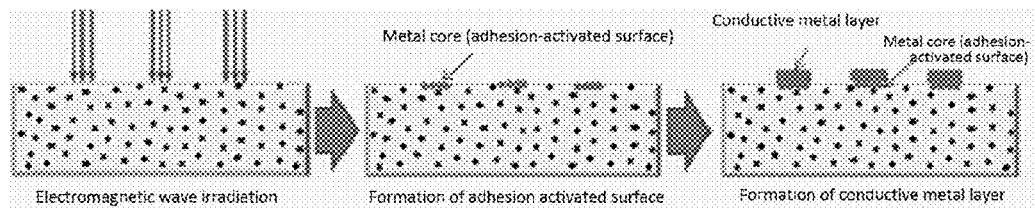

[FIG. 3]
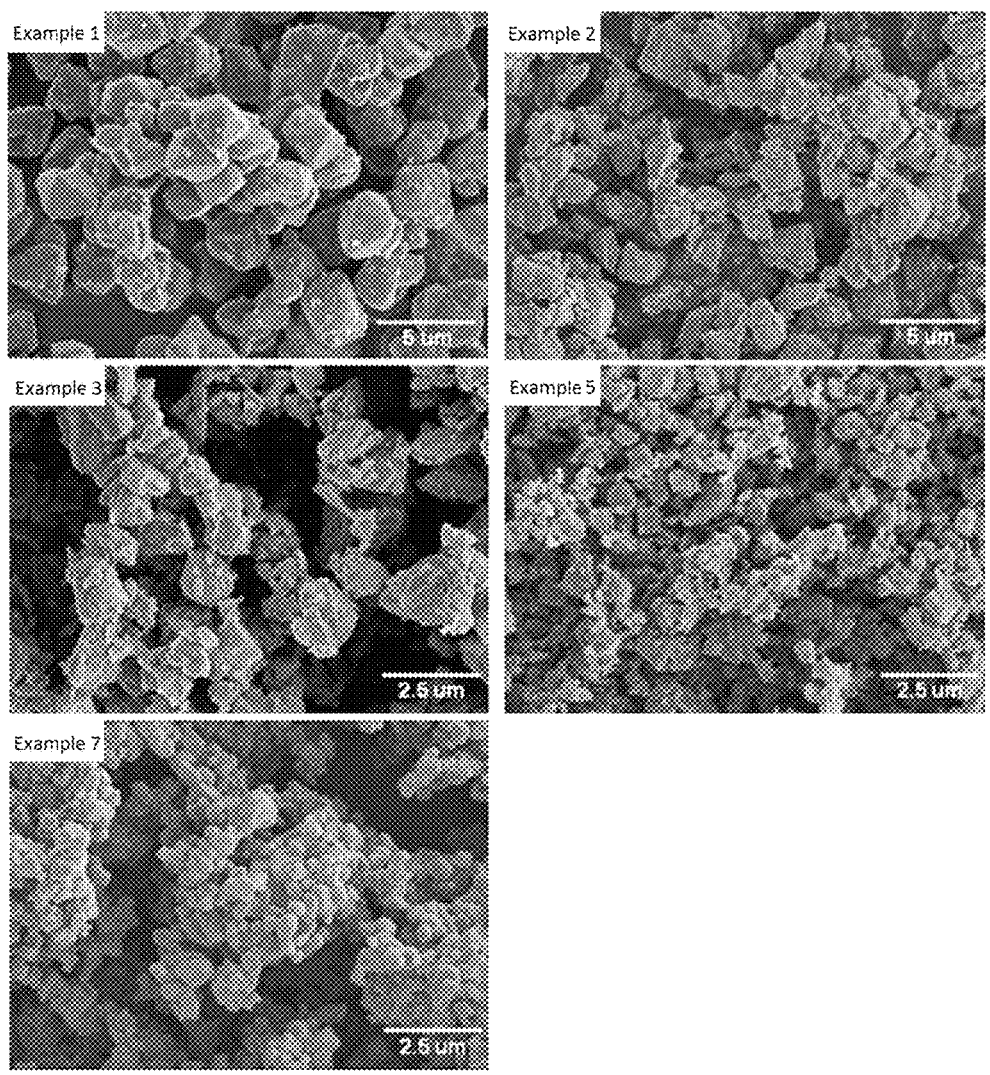

COMPOSITION FOR FORMING CONDUCTIVE PATTERN, METHOD FOR FORMING CONDUCTIVE PATTERN USING THE SAME, AND RESIN COMPONENTS HAVING CONDUCTIVE PATTERN THEREON

This application is a National Stage Application of International Application No. PCT/KR2015/003850, filed on Apr. 16, 2015, which claims the benefit of Korean Patent Application No. 10-2014-0045551, filed on Apr. 16, 2014, all of which are hereby incorporated by reference in their entirety for all purposes as if fully set forth herein.

TECHNICAL FIELD

The present invention relates to a composition for forming a conductive pattern capable of forming a fine conductive pattern, reducing degradation of mechanical physical properties and having excellent adhesion strength, on a polycarbonate-based resin product or resin layer, a method for forming a conductive pattern using the same, and a resin components having the conductive pattern thereon.

BACKGROUND ART

With the recent development of microelectronic technology, a need for structures having a fine conductive pattern formed on the surface of a polymeric resin substrate (or product) such as a variety of resin products or resin layers has increased. The conductive patterns on the surface of the polymeric resin substrate and the structure may be applied to form various objects such as antennas integrated into a mobile phone case, a variety of sensors, MEMS structures, RFID tags, or the like.

As described above, with increasing interest in the technology of forming the conductive pattern on the surface of the polymeric resin substrate, several technologies regarding this have been suggested. However, a method capable of more effectively using these technologies has not been suggested yet.

For example, according to the previously known technology, a method for forming the conductive pattern by forming a metal layer on the surface of the polymeric resin substrate and then applying photolithography, a method for forming the conductive pattern by printing a conductive paste, or the like may be considered. However, when the conductive pattern is formed according to this technology, there are limitations that a required process or equipment becomes too complicated, or it is difficult to form an excellent fine conductive pattern.

Accordingly, there is a need to develop a technology capable of more effectively forming the fine conductive pattern on the surface of the polymeric resin substrate by a simple process.

In order to fulfill the demand in the art, a technology of forming the conductive pattern by using a composition including a specific non-conductive metal compound, and the like blended to a polymeric resin, and performing direct irradiation with electromagnetic waves such as laser, has been suggested. According to this technology, a predetermined region of the composition is directly irradiated with the electromagnetic waves such as laser to selectively expose metal components of the non-conductive metal compound, followed by proceeding with electroless plating and the like on the corresponding region, thereby forming the conductive pattern.

However, when this technology is applied, brittleness is increased by the addition of the non-conductive metal compound, so that basic mechanical physical properties such as impact strength of the polymeric resin substrate (or product) itself are often deteriorated.

Particularly, if the conductive pattern is formed by the direct irradiation with electromagnetic waves, generally the polymeric resin is fabricated into a film or sheet form having a two-dimensional planar structure, and thus, only the physical properties changed in the process for processing into a film or sheet, that is, elongation, shrinkage, or the like were often considered. Therefore, mechanical physical properties such as tensile strength and impact strength were much deteriorated, so that durability required for a product as a tree-dimensional structure was often not satisfied.

Further, when the conductive pattern is formed by the above technology, the conductive pattern has poor adhesion strength with the polymeric resin substrate, such that there is also a problem such as an excellent conductive pattern being difficult to be formed.

Because of this, currently the above-described technology is not widely applied, and there is a continuous demand for improvement of the related technology.

SUMMARY OF INVENTION

Technical Problem

The present invention has been made in an effort to provide a composition for forming a conductive pattern capable of reducing degradation of mechanical physical properties and forming a fine conductive pattern having excellent adhesion strength, on a variety of polycarbonate-based resin products or resin layers, and a method for forming a conductive pattern using the same.

In addition, the present invention has been made in an effort to provide a resin component having the conductive pattern which is formed from the composition for forming the conductive pattern, or the like.

Solution to Problem

An exemplary embodiment of the present invention provides a composition for forming a conductive pattern by electromagnetic wave irradiation, including: a polycarbonate-based resin; and particles of a non-conductive metal compound including a first metal element and a second metal element and having a spinel structure, wherein the particles have a particle diameter of 0.1 to 6 μm; wherein a metal nuclei including the first metal element, the second metal element, or an ion thereof is formed from the particles of the non-conductive metal compound by electromagnetic wave irradiation.

In the composition for forming a conductive pattern, the particles of the non-conductive metal compound may include at least one non-conductive metal compound represented by following Chemical Formula 1, 2 or 3, or be particles of a mixture including another non-conductive metal compound together with the non-conductive metal compound:

  [Chemical Formula 1]

  [Chemical Formula 2]

  [Chemical Formula 3]

wherein

A and B are independently of each other the first and the second metal elements, and one of which is at least one metal selected from the group consisting of Cu, Ag, Pd, Au, Pt, Ni and Sn, and the other of which is at least one metal selected from the group consisting of Cr, Fe, Mo, Mn, Co and W;

M is at least one metal selected from the group consisting of Cr, Fe, Mo, Mn, Co and W, and different from A or B;

a is a real number more than 0 less than 1, and b is a real number more than 0 less than 2; and X is oxygen, nitrogen or sulfur.

Further, in the composition for forming a conductive pattern, the polycarbonate-based resin may be exemplified by a resin including polycarbonate alone, or a resin including a polycarbonate resin; and further, at least one selected from the group consisting of an ABS resin, an aromatic or aliphatic (meth)acrylate resin, a rubber modified vinyl-based graft copolymer resin, and a polyalkyene terephthalate resin.

Further, in the composition for forming the conductive pattern, the non-conductive metal compound particles may be included at about 0.1 to 7 wt %, based on the total composition, and the remaining amount of the polycarbonate-based resin is included.

In addition, the composition for forming the conductive pattern may further include at least one additive selected from the group consisting of an inorganic filler, a colorant such as a pigment, a flame retardant, an impact reinforcing agent, and other functional reinforcing agents, in addition to the above-described polycarbonate-based resin and the predetermined non-conductive metal compound particles.

Meanwhile, another exemplary embodiment of the present invention provides a method for forming a conductive pattern by direct electromagnetic wave irradiation, on a polycarbonate-based resin substrate such as a resin product or a resin layer, using the above-described composition for forming a conductive pattern. Such method for forming the conductive pattern may include molding the composition for forming a conductive pattern as described above into a resin product, or applying the composition to another product so as to form a resin layer; irradiating a predetermined region of the resin product or the resin layer with an electromagnetic wave, so as to generate a metal nuclei including a first metal, a second metal, or an ion thereof from the non-conductive metal compound particles; and chemically reducing or plating the region where the metal nuclei is generated, so as to form a conductive metal layer.

In the method for forming the conductive pattern, a laser electromagnetic wave may be irradiated in the step of generating the metal nuclei, and for example, a laser electromagnetic wave having a wavelength of about 248 nm, about 308 nm, about 355 nm, about 532 nm, about 755 nm, about 1064 nm, about 1550 nm, or about 2940 nm may be irradiated, and among these, it is preferred that the laser electromagnetic wave having a wavelength of about 1064 nm is irradiated. In another example, a laser electromagnetic wave having a wavelength in the infrared (IR) region may be irradiated.

Further, as the step of generating the metal nuclei by the electromagnetic wave irradiation proceeds, the non-conductive metal compound particles may be partially exposed on the surface of the predetermined region of the resin product or the resin layer, from which the metal nuclei is generated, thereby forming a surface activated so as to have a higher adhesion property (hereinafter, referred to as an adhesion-activated surface). Subsequently, the conductive metal layer may be formed on the adhesion-activated surface by electroless plating. During the electroless plating, the metal nuclei serves as a kind of seed to form a strong bonding with the conductive metal ions included in the plating solution, when the conductive metal ions are chemically reduced. As a result, the conductive metal layer may be more easily selectively formed.

Meanwhile, still another exemplary embodiment of the present invention provides a resin component having a conductive pattern obtained by using the composition for forming a conductive pattern and the method for forming a conductive pattern as described above. The resin component may include a polycarbonate-based resin substrate; particles of a non-conductive metal compound including a first metal element and a second metal element and having a spinel structure, wherein the particles have a particle diameter of about 0.1 to 6 μm, and are dispersed in the polycarbonate-based resin substrate; an adhesion-activated surface including a metal nuclei including a first metal element, a second metal element or an ion thereof exposed on a surface of a predetermined region of the polycarbonate-based resin substrate; and a conductive metal layer formed on the adhesion-activated surface.

In the resin component, the predetermined region where the adhesion-activated surface and the conductive metal layer are formed may correspond to the region of the polycarbonate-based resin substrate irradiated with the electromagnetic wave.

In addition, in the resin component, the conductive metal layer may be formed on the polycarbonate-based resin substrate with excellent adhesion strength at which a delamination area of the metal layer is about 0% (ISO Class 0), or more than about 0% to 5% or less (ISO Class 1), of the area of the target metal layer to be tested, when tested according to the standard ISO 2409.

Further, the resin component may have impact strength of about 4.0 J/cm or more, as measured according to the ASTM D256.

Advantageous Effects of Invention

According to the present invention, a composition for forming a conductive pattern capable of forming a fine conductive pattern on a polycarbonate-based resin substrate such as a variety of polycarbonate-based resin products or resin layers by a very simplified process of irradiating an electromagnetic wave such as laser, a method for forming a conductive pattern using the same, and a resin component having a conductive pattern may be provided.

Particularly, as non-conductive metal compound particles having a unique three-dimensional structure and a predetermined range of a particle diameter are used, the composition for forming a conductive pattern and others according to the present invention may more effectively form a fine conductive pattern, reducing degradation of mechanical physical properties such as impact strength of a polymeric resin product or a resin layer itself, and representing excellent adhesion strength.

Therefore, the composition for forming the conductive pattern or the method for forming the conductive pattern may be used to very effectively form a conductive pattern for antennas on a variety of resin products such as a mobile phone case, RFID tags, various sensors, MEMS structures, and the like.

BRIEF DESCRIPTION OF THE DRAWINGS

FIG. 1 is a drawing schematically illustrating a three-dimensional structure of an example of a non-conductive metal compound included in a composition for forming a conductive pattern according to an exemplary embodiment of the present invention.

FIG. 2 is a drawing briefly illustrating each process step of an example of a method for forming a conductive pattern according to another exemplary embodiment of the present invention.

FIG. 3 is electron microscopic images of non-conductive metal compounds included in the compositions for forming a conductive pattern according to various Examples of the present invention.

DESCRIPTION OF EMBODIMENTS

In the present invention, the terms such as "first" and "second" are used to describe various components, and the terms are used only in order to distinguish one component from other components.

In addition, terms used in the present specification are used only in order to describe exemplary embodiments rather than limiting the present invention. Singular forms are intended to include plural forms unless otherwise indicated contextually. It is to be understood that the terms such as "comprises", "include" and "have" used in this specification, imply the existence of stated features, numbers, steps, components, or a combination thereof, but do not preclude the presence or addition of one or more other features, numbers, steps, components, or a combination thereof.

Further, in the present invention, when it is stated that each layer or element is formed "on" or "over" respective layers or elements, this means that each layer or element may be formed directly on the respective layers or elements, or another layer or element may be additionally formed between the respective layers or on a target object or substrate.

Since the present invention may be variously modified and have various types, specific exemplary embodiments of the present invention will be illustrated and be described in detail below. However, it is to be understood that the present invention is not limited to a specific disclosed form, but includes all of the modifications, equivalents, and substitutions within the spirit and technical scope of the present invention.

Hereinafter, a composition for forming a conductive pattern, a method for forming a conductive pattern using the same, and a resin component having a conductive pattern according to specific exemplary embodiments of the present invention will be described.

According to an exemplary embodiment of the present invention, there is provided a composition for forming a conductive pattern by electromagnetic wave irradiation, including: a polycarbonate-based resin; and particles of a non-conductive metal compound including a first metal and a second metal and having a spinel structure, wherein the particles have a particle diameter of 0.1 to 6 µm; wherein a metal nuclei including the first metal, the second metal, or an ion thereof is formed from the particles of the non-conductive metal compound by electromagnetic wave irradiation.

The composition for forming a conductive pattern includes particles of a non-conductive metal compound having a specific three-dimensional structure defined as a spinel structure, and a specific particle diameter of 0.1 to 6 µm, or about 0.2 to 6 µm, more preferably about 0.3 to 4 µm.

The particle diameter which is the size of primary particles of a non-conductive metal compound having a spinel structure, is measurable through an image analysis such as a SEM or an optical microscopy.

Further, the non-conductive metal compound may have an average specific surface area of about 0.5 to 10 $m^2/g$, preferably about 0.5 to 8 $m^2/g$, more preferably about 0.7 to about 3 $m^2/g$.

A three-dimensional structure of an exemplary embodiment of the non-conductive metal compound which is a main component of the particles is schematically illustrated in FIG. 1.

Referring to FIG. 1, the non-conductive metal compound includes at least one metal of the first metal element and the second metal element, and may have a three-dimensional structure in which one metal atom of the first and second metals occupies octahedral sites in a form where a nonmetal element is arranged in a cubic closest packing structure or a face centered structure, and the other metal atom occupies a part of tetrahedral sites, this three-dimensional structure being referred to as a spinel structure.

When the composition for forming a conductive pattern including these particles of the non-conductive metal compound is used to mold a polymeric resin product or a resin layer, which is then irradiated with electromagnetic wave such as laser, a metal nuclei including the first metal element, the second metal element or the ion thereof may be formed from the non-conductive metal compound. This metal nuclei may be selectively exposed on the predetermined region irradiated with the electromagnetic wave to form the adhesion-activated surface on the surface of the polymeric resin substrate. Thereafter, when electroless plating with a plating solution including conductive metal ions and the like, using the metal nuclei and the like including the first metal element, the second metal element or the ion thereof as a seed, is performed thereon, a conductive metal layer may be formed on the adhesion-activated surface including the metal nuclei. Through this process, the conductive metal layer, in other words, a fine conductive pattern may be selectively formed only on the predetermined region of the polymeric resin substrate irradiated with the electromagnetic wave.

Particularly, as the composition for forming a conductive pattern of the exemplary embodiment includes the particles of the non-conductive metal compound having a specific three-dimensional structure of the spinel structure, that is, the three-dimensional structure as described above, at least one of the first metal element, the second metal element or the ion thereof may be easily released by irradiation with the electromagnetic wave. As a result, the adhesion-activated surface having the metal nuclei by irradiation with the electromagnetic wave may be more easily formed, and by plating the adhesion-activated surface, a good and fine conductive metal layer may be effectively formed.

Besides, as a result of experiment by the present inventors, it was confirmed that as the particles of the non-conductive metal compound have the particle diameter range as described above, the dispersion of the particles in a resin composition is improved, and surface activation is possible with only a small amount of laser irradiation.

If the particles have a larger particle diameter than the above range, the non-conductive metal compound will not be uniformly dispersed within the polymeric resin, so that the surface activation is not effectively done even after laser irradiation. Further, as the average particle diameter is increased, a specific surface area is decreased, and the exposed region of the non-conductive metal compound is relatively reduced, thereby increasing laser irradiation amount (intensity or average output amount) required for surface activation.

Meanwhile, if the particles of the non-conductive metal compound have an unduly small particle diameter, the specific surface area will be greatly increased, thereby increasing moisture absorptivity and the like, which causes a side reaction with the polycarbonate-based resin. This side reaction may weaken the excellent mechanical physical properties and the like originally possessed by the polycarbonate resin, thereby being a cause of degradation of processability, and in addition, decrease in the impact strength and the like of manufactured products may lower durability of the products. Further, dust generation level during processing may be increased to cause inconvenience in the process.

However, if the non-conductive metal compound particles have the average particle diameter within the above range, these problems may be reduced, and lowered physical properties of the polycarbonate-based resin and the like may be suppressed, simultaneously with the inconvenience in the process being reduced.

In addition, the non-conductive metal compound particles having the particle diameter range as described above may more sensitively react to the electromagnetic wave, even under a condition of relatively low power of irradiation with the electromagnetic wave such as laser, thereby forming an adhesion-activated surface with higher roughness. As a result, the fine conductive pattern representing better adhesion strength on the adhesion-activated surface may be favorably formed.

Additionally, since the non-conductive metal compound particles may more sensitively react to the electromagnetic wave due to the particle diameter range as described above, the conductive pattern may be more effectively formed even in the case of lowering the content of the non-conductive metal compound particles blended to the polycarbonate-based resin, itself.

FIG. 3 is an electron microscopic image of a non-conductive metal compound included in the composition for forming a conductive pattern according to an exemplary embodiment of the present invention. Referring to FIG. 3, it is confirmed that the non-conductive metal compound used in an exemplary embodiment of the present invention has a particle diameter range of about 0.1 to 6 μm.

Meanwhile, in the composition for forming a conductive pattern of the exemplary embodiment, the particles of the non-conductive metal compound may have a specific surface area of about 0.5 to about 10 $m^2/g$, preferably about 0.5 to about 8 $m^2/g$. If the specific surface area is larger than the range, a water absorption ability may be increased, which causes a side reaction with the polycarbonate-based resin, and if the specific surface area is smaller than the range, the mechanical physical properties of the resin may be deteriorated.

Meanwhile, in the composition for forming a conductive pattern of the exemplary embodiment, the particles of the non-conductive metal compound may include at least one non-conductive metal compound represented by following Chemical Formula 1 or 2, or include another non-conductive metal compound together with the non-conductive metal compound in a mixture form:

$AB_2X_4$         [Chemical Formula 1]

$B(AB)X_4$         [Chemical Formula 2]

        [Chemical Formula 3]

wherein
A and B are independently of each other the first and the second metal elements, and one of which is at least one metal selected from the group consisting of Cu, Ag, Pd, Au, Pt, Ni and Sn, and the other of which is at least one metal selected from the group consisting of Cr, Fe, Mo, Mn, Co and W;

M is at least one metal selected from the group consisting of Cr, Fe, Mo, Mn, Co and W, and different from A or B;

a is a real number more than 0 less than 1, and b is a real number more than 0 less than 2; and X is oxygen, nitrogen or sulfur.

That is, in the above compound, if two metals are used as the metal, the non-conductive metal compound as described above may be represented by the above Chemical Formula 1 or 2, and if three metals different from each other are used, the non-conductive metal compound as described above may be represented by the above Chemical Formula 3.

Further, if the non-conductive metal compound represented by the above Chemical Formula 3 is used, the metal included therein may be varied in its kind and ratio, thereby efficiently form the adhesion-activated surface for forming various conductive patterns.

Herein, the three-dimensional structure of the non-conductive metal compound represented by the above Chemical Formula 1 may be explained by the above-described spinel structure. For example, a structure in which a X atom forms a cubic closest packing structure or a faced centered cubic structure, an A atom occupies a part of the tetrahedral sites surrounded by the X atom in a divalent cationic form, and a B atom occupies a half of octahedral sites surrounded by X atom in a trivalent cationic form, may be formed.

Further, the three-dimensional structure of the non-conductive metal compound represented by the above Chemical Formula 2 may be explained by a reverse spinel structure. In the reverse spinel structure, for example, a structure in which the B atom occupies tetrahedral sites, and the remaining B atom and an A atom occupy octahedral sites, may be formed.

In addition, the three-dimensional structure of the non-conductive metal compound represented by the above Chemical Formula 3 may be the above-described spinel structure wherein the atom corresponding to M is mainly positioned at the tetrahedral sites of the spinel structure, and the M atom may be partly positioned at octahedral sites.

Herein, the metal atom positioned at the tetrahedral sites may be a metal source released from the non-conductive metal compound by the electromagnetic wave irradiation.

The above-described non-conductive metal compound may be, specifically for example, $CuCr_2O_4$, $CuCo_2O_4$, $PtMn_2O_4$, $CrCuCrO_4$, $CuCrMnO_4$, $[Cu_{0.5}Mn_{0.5}][CrMn]O_4$, and $[Cu_{0.5}Mn_{0.5}][Cr_{0.5}Mn_{1.5}]O_4$, but not necessarily limited thereto, and various types of the non-conductive metal compound satisfying the above described Chemical Formulae may be used.

In particular, if the compound of $[Cu,Mn][Cr,Mn]O_4$ is used, there may be an advantage capable of being used as a greater variety of applications, since a conductive pattern having various forms and physical properties may be formed from a prepared resin component.

In order to obtain the particles of the non-conductive metal compound in the specific range of the particle diameter range, the first and the second metal-containing precursors forming the particles may be mixed with each other and sintered at high temperature, thereby obtaining the non-conductive metal compound, which is then crushed through a milling process. After obtaining the particles of the non-conductive metal compound having the desired particle diameter range by the comminution process, the particles may be dried to use in the above-described composition for forming a conductive pattern. However, since the conditions and method of proceeding with the comminution process may follow a comminution process such as a milling process of general inorganic particles (metal oxide particles and the like), and the particles of the non-conductive metal compound may be prepared according to a preparation process of the other general metal oxide particles, further description on this will be omitted.

Meanwhile, in the above-described composition for forming a conductive pattern of an exemplary embodiment, as the polycarbonate-based resin, a polycarbonate-based resin capable of forming various resin products or resin layers may be used. In particular, the particles of the non-conductive metal compound having the above-described specific three-dimensional structure and particle diameter may exhibit excellent compatibility with various polycarbonate-based resins and uniform dispersibility therein, and may hardly deteriorate mechanical physical properties such as impact strength of the polycarbonate-based resin. Therefore, the composition of an exemplary embodiment may further include various polymeric resins and be molded into various resin products or resin layers. The specific examples of the polycarbonate-based resin may include a resin including polycarbonate alone, or a resin including a polycarbonate resin, and further, at least one selected from the group consisting of an ABS resin, an aromatic or aliphatic (meth) acrylate resin, a rubber modified vinyl-based graft copolymer resin, and a polyalkyene terephthalate resin.

Further, in the composition for forming a conductive pattern, the non-conductive metal compound may be included at about 0.1 to about 7 wt %, or about 0.5 to about 7 wt %, or about 2 to about 6 wt %, based on the total composition, and the remaining amount of the polycarbonate-based resin may be included. According to the above-described amount range, the polymeric resin products or the resin layers formed from the composition may excellently maintain the basic physical properties such as the inherent mechanical physical properties of the polycarbonate resin, and preferably exhibit a property of forming a conductive pattern on a predetermined region by the electromagnetic wave irradiation. As previously described, the composition of an exemplary embodiment may include the non-conductive metal compound particles having the specific three-dimensional structure and particle diameter range, such that even though the non-conductive metal compound particles are included at lower content, the metal nuclei and the conductive pattern having excellent adhesion strength may be favorably formed by the electromagnetic wave irradiation. Therefore, by decreasing the content of the non-conductive metal compound particles, basic physical properties of the resin products or the resin layers may be more excellently maintained, and colors of the additives may be hidden, whereby polymeric resin products showing various colors may be easily provided.

In addition, the composition for forming the conductive pattern may further include at least one additive selected from the group consisting of an inorganic filler, a colorant such as a pigment, a flame retardant, an impact reinforcing agent, and other functional reinforcing agents, in addition to the above-described polycarbonate-based resin and the predetermined non-conductive metal compound.

In order to supplement the mechanical physical properties and the like of the polymeric resin product or the resin layer formed from the composition, other usual inorganic fillers may be included, and in addition to that, various additives known as being usable in a composition for molding a resin product may be used without particular limitation.

Meanwhile, according to another exemplary embodiment of the present invention, there is provided a method for forming a conductive pattern by direct electromagnetic wave irradiation, on a polycarbonate-based resin substrate such as a resin product or a resin layer, using the above-described composition for forming a conductive pattern. Such method for forming the conductive pattern may include molding the composition for forming a conductive pattern as described above into a resin product, or applying the composition to another product so as to form a resin layer; irradiating a predetermined region of the resin product or the resin layer with an electromagnetic wave, so as to generate metal nuclei including a first metal, a second metal or an ion thereof from the non-conductive metal compound particles; and chemically reducing or plating the region where the metal nuclei is generated, so as to form a conductive metal layer.

Hereinafter, referring to the attached drawings, the method for forming a conductive pattern according to another exemplary embodiment will be described for each step. For reference, FIG. 2 briefly illustrates each step of an example of a method of forming a conductive pattern.

In the method for forming the conductive pattern, first, the above-described composition for forming the conductive pattern may be molded into the resin product, or applied to another product so as to form the resin layer. In the molding of the resin product or the forming of the resin layer, general methods for molding products using polycarbonate-based resin compositions or general methods for forming resin layers may be applied without specific limitation. For example, in the molding of the resin product using the composition, the composition for forming the conductive pattern is extruded and cooled to form pellets or particles, which are subjected to injection molding to have a desired shape, thereby manufacturing various polymeric resin products.

The thus-formed polycarbonate-based resin product or the resin layer may have the above-described non-conductive metal compound particles of the specific three-dimensional structure and particle diameter range as described above which are uniformly dispersed on the resin substrate formed from the polycarbonate-based resin. In particular, since the particles of the non-conductive metal compound have excellent compatibility with various polycarbonate-based resins, sufficient solubility therein, and chemical stability therewith, it may be uniformly dispersed throughout the resin substrate, thereby being maintained in a non-conductive state.

After forming the polycarbonate-based resin product or the resin layer, as illustrated in the first drawing of FIG. 2, the predetermined region of the resin product or the resin layer on which the conductive pattern is intended to be formed may be irradiated with an electromagnetic wave such as laser. When the electromagnetic wave is irradiated, the first metal, the second metal or the ion thereof may be released from the non-conductive metal compound, and the metal nuclei including the first metal, the second metal, or the ion thereof may be generated (see the second drawing of FIG. 2).

More specifically, as the step of generating the metal nuclei by the electromagnetic wave irradiation proceeds, the non-conductive metal compound particles may be partially exposed on the surface of the predetermined region of the resin product or the resin layer, from which the metal nuclei is generated, thereby forming an adhesion-activated surface to be activated so as to have a higher adhesion property. As the adhesion-activated surface is selectively formed only on the specific region irradiated with the electromagnetic wave, when a plating step as described below proceeds, the conductive metal ions are chemically reduced by chemical reduction of the first or second metal ions included in the metal nuclei and the adhesion-activated surface, and/or by electroless plating thereof, such that the conductive metal layer may be selectively formed on the predetermined region of the polycarbonate-based resin substrate. More specifically, during the electroless plating, the metal nuclei functions as a kind of seed to form a strong bonding with the conductive metal ions included in the plating solution, when the conductive metal ions are chemically reduced. As a result, the conductive metal layer may be selectively formed in an easier manner.

In particular, as the non-conductive metal compound particles have the specific particle diameter range, they may be more sensitively reacted even under relatively low power of the irradiation with the electromagnetic wave such as laser, such that the adhesion-activated surface with higher roughness may be formed, and the conductive metal layer (conductive pattern) having improved adhesion strength may be formed on the resin products or the resin layers therefrom.

Meanwhile, in a step of generating the above-described metal nuclei, among electromagnetic waves, a laser electromagnetic wave may be irradiated, and for example, a laser electromagnetic wave having a wavelength of about 248 nm, about 308 nm, about 355 nm, about 532 nm, about 755 nm, about 1064 nm, about 1550 nm, or about 2940 nm may be irradiated, and among these, it is preferred that the laser electromagnetic wave having a wavelength of about 1064 nm is irradiated. In another example, a laser electromagnetic wave having a wavelength in the infrared (IR) region may be irradiated.

By means of the irradiation with the laser, the metal nuclei may be more effectively generated from the non-conductive metal compound, and the adhesion-activated surface including the metal nuclei may be selectively generated and exposed on a predetermined region.

In addition, since the non-conductive metal compound may effectively produce the adhesion-activated surface by a relatively small amount of the electromagnetic wave irradiation, without adding a separate radiation absorber, degeneration of the polymeric resin by separately adding a radiation absorber, or degeneration of the polymeric resin by the electromagnetic wave irradiation may be effectively inhibited.

The laser electromagnetic wave may be irradiated under general conditions or power, however, as the non-conductive metal compound particles having the above-described specific particle diameter are used, the adhesion-activated surface with higher roughness may be formed, even by lower power of the laser electromagnetic wave irradiation, and electroless plating may be performed thereon to form the conductive metal layer having excellent adhesion strength.

Meanwhile, after the above-described step of generating the metal nuclei, the step of forming the conductive metal layer by chemically reducing or plating the region where the metal nuclei is generated may be carried out, as illustrated in the third drawing of FIG. 2. As a result of carrying out the reducing or plating step, the conductive metal layer may be selectively formed on the predetermined region where the metal nuclei and the adhesion-activated surface are exposed, and on the remaining region, the chemically stable non-conductive metal compound may maintain non-conductivity as it is. Accordingly, the fine conductive pattern may be selectively formed only on the predetermined region of the polycarbonate-based resin substrate.

More specifically, the step of forming the conductive metal layer may proceed by the electroless plating, and therefore, a favorable conductive metal layer may be formed on the adhesion-activated surface.

In one example, in the reducing or the plating step, the predetermined region of the resin product or the resin layer in which the metal nuclei is generated may be treated with an acidic or basic solution including a reducing agent, and the solution may include at least one selected from the group consisting of formaldehyde, hypophosphite, dimethylamino borane (DMAB), diethylamino borane (DEAB) and hydrazine as the reducing agent. In addition, in the reducing or plating step, the conductive metal layer may be formed by the electrode plating for treatment with an electroless plating solution including the above-described reducing agent and the conductive metal ions, and the like.

As the reducing or plating step proceeds, the first or the second metal ions included in the metal nuclei may be reduced, or the conductive metal ions included in the electroless plating solution are chemically reduced in the region where the metal nuclei is formed as a seed, and therefore, an excellent conductive pattern may be selectively formed on the predetermined region. Herein, the metal nuclei and the adhesion-activated surface may form a strong bonding with the chemically reduced conductive metal ions, and as a result, the conductive pattern may be more easily formed selectively on the predetermined region.

Meanwhile, according to still another embodiment, there is provided a resin component having the conductive pattern which is obtained by using the composition for forming the conductive pattern and the method for forming the conductive pattern as described above. The resin component may include a polycarbonate-based resin substrate; particles of a non-conductive metal compound including a first metal and a second metal and having a spinel structure, wherein the particles have a particle diameter of about 0.1 to 6 μm, and are dispersed in the polycarbonate-based resin substrate; an adhesion-activated surface including a metal nuclei including a first metal, a second metal or an ion thereof exposed on a surface of a predetermined region of the polycarbonate-based resin substrate; and a conductive metal layer formed on the adhesion-activated surface.

In the resin component, the predetermined region where the adhesion-activated surface and the conductive metal layer are formed may correspond to the region of the polycarbonate-based resin substrate irradiated with the electromagnetic wave. In addition, the first metal, second metal or the ion thereof included in the metal nuclei of the adhesion-activated surface may be derived from the non-conductive metal compound particles. Meanwhile, the conductive metal layer may be derived from the first metal or the second metal, or from the conductive metal ions included in the electroless plating solution.

Meanwhile, in the resin component, the conductive metal layer is formed by using the non-conductive metal compound particles having the specific diameter range, and the like, such that the conductive metal layer may be formed on the polycarbonate-based resin substrate with better adhesion strength. For example, the conductive metal layer may be formed on the polycarbonate-based resin substrate by excellent adhesion strength at which a delamination area of the metal layer is 0% (ISO Class 0), or more than 0% to 5% or less (ISO Class 1), of an area of a target metal layer under test, when tested according to the ISO 2409 standard.

In addition, the resin component may be manufactured in a three-dimensional shape having any one or more of a length, a width and a thickness of 500 um or more, preferably 1000 um or more, as well as a two-dimensional shape of a film or sheet. That is, even in the case of adding the additives for forming the conductive pattern, in the course of processing such as injection molding, reduction in excellent impact strength of the conventional polycarbonate-based resin component may be minimized. Thus, even in the case of manufacturing a structure in a three-dimensional shape without adding a separate reinforcing agent, excellent durability may be secured.

Specifically, the resin component may have impact strength of about 4.0 J/cm or more, preferably about 5 to about 10 J/cm, more preferably about 5.5 to 7.5 J/cm, as measured according to the ASTM D256, despite the addition of the above-described non-conductive metal compound. Therefore, using the structure, the polycarbonate-based resin product having the conductive pattern formed on the polycarbonate-based resin substrate, and maintaining excellent mechanical physical properties, may be provided.

Additionally, the resin component may further include residues which are dispersed in the polycarbonate-based resin substrate and derived from the non-conductive metal compound. These residues may have a structure in which at least a part of the first or second metal elements is released from the three-dimensional structure of the non-conductive metal compound to form a vacancy in at least a portion of the released position.

The above described resin component may form various resin products or resin layers such as a mobile phone case having the conductive pattern for an antenna, or various resin products or resin layers having the conductive pattern, such as RFID tags, various sensors, MEMS structures, or the like.

Hereinafter, actions and effects of the present invention will be described in detail, with reference to specific Examples of the present invention. However, the Examples are illustrative only, and not intended to limit the scope of the preset invention.

Example 1: Formation of Conductive Pattern by Direct Laser Irradiation

CuO and $Cr_2O_3$ (available from Sigma Aldrich) as raw material powder were mixed at a mole ratio of 1:1, and subjected to heat treatment at 600° C. for 3 hours to synthesize a non-conductive metal compound having a structure of $CuCr_2O_4$. The particle size of the synthesized $CuCr_2O_4$ was adjusted through a comminution process by ball milling. The average particle diameter of the used $CuCr_2O_4$ primary particle was 4.0 μm.

A polycarbonate resin as a base resin, and $CuCr_2O_4$ particles having a spinel structure as a LDS additive were used, together with a thermal stabilizer (IR1076, PEP36), a UV stabilizer (UV329), a lubricant (EP184), and an impact reinforcing agent (S2001) as additives for processing and stabilization, to prepare a composition for forming a conductive pattern by electromagnetic wave irradiation.

90 wt % of a polycarbonate resin, 5 wt % of a LDS additive, 4 wt % of an impact reinforcing agent, and 1 wt % of the other additives were mixed to obtain a composition, which was extruded through an extruder at 260 to 280° C. The extruded pellet-type resin component was subjected to injection molding at approximately 260 to 270° C. to obtain a substrate having a diameter of 100 mm and a thickness of 2 mm as an izod bar type according to the ASTM standard.

The izod notched impact strength of the injection molded resin component was measured according to the ASTM D256 standard.

The resin component was irradiated with laser under a condition of 40 kHz and 10 W, thereby activating the surface, and subjected to an electroless plating process as follows:

A plating solution (hereinafter, referred to as 'PA solution') was prepared by dissolving 3 g of copper sulfate, 14 g of Rochelle salt, and 4 g of sodium hydroxide in 100 ml of deionized water. To 40 ml of the thus prepared PA solution, 1.6 ml of formaldehyde as a reducing agent was blended. The resin component of which surface was activated by laser was immersed in the plating solution for 4 to 5 hours, and then washed with distilled water. Adhesion performance of the thus formed conductive pattern (plating layer) was evaluated according to the ISO 2409 standard.

Example 2: Formation of Conductive Pattern by Direct Laser Irradiation

A composition for forming a conductive pattern was prepared in the same manner as in Example 1, except that non-conductive metal compound ($CuCr_2O_4$) as the LDS additive having an average particle diameter of 2.5 μm, were used, and a resin component having a conductive pattern was manufactured therefrom.

Example 3: Formation of Conductive Pattern by Direct Laser Irradiation

A composition for forming a conductive pattern was prepared in the same manner as in Example 1, except that non-conductive metal compound ($CuCr_2O_4$) as the LDS additive having an average primary particle diameter of 1.0 μm, were used, and a resin component having a conductive pattern was manufactured therefrom.

Example 4: Formation of Conductive Pattern by Direct Laser Irradiation

A composition for forming a conductive pattern was prepared in the same manner as in Example 3, except that non-conductive metal compound ($CuCr_2O_4$) as the LDS additive were blended in an amount of 3 wt %, and a resin component having a conductive pattern was manufactured therefrom.

Example 5: Formation of Conductive Pattern by Direct Laser Irradiation

A composition for forming a conductive pattern was prepared in the same manner as in Example 1, except that non-conductive metal compound ($CuCr_2O_4$) as the LDS additive having an average primary particle diameter of 0.2 μm, were used, and a resin component having a conductive pattern was manufactured therefrom.

Example 6: Formation of Conductive Pattern by Direct Laser Irradiation

A composition for forming a conductive pattern was prepared in the same manner as in Example 5, except that non-conductive metal compound ($CuCr_2O_4$) as the LDS additive were blended in an amount of 3 wt %, and a resin component having a conductive pattern was manufactured therefrom.

Example 7: Formation of Conductive Pattern by Direct Laser Irradiation

A composition for forming a conductive pattern was prepared in the same manner as in Example 1, except that non-conductive metal compound particles of [Cu,Mn][Cr, Mn]$_2$O$_4$ (available from Tomatec, JP) as the LDS additive were blended in an amount of 5 wt %, and a resin component having a conductive pattern was manufactured therefrom. The used non-conductive metal compound had an average primary particle diameter of about 0.5 μm, and an average secondary particle diameter of about 2 μm, wherein the secondary particle is formed by agglomeration of primary particles.

The features of Examples 1 to 7 are summarized in following Table 1:

TABLE 1

| | Average primary particle diameter of non-conductive metal compound (D$_{50}$) (μm) | Content of non-conductive metal compound (wt %) | Average specific surface area of non-conductive metal compound (m$^2$/g) |
|---|---|---|---|
| Example 1 | 4.0 | 5 | 0.78 |
| Example 2 | 2.5 | 5 | 1.66 |
| Example 3 | 1.0 | 5 | 2.67 |
| Example 4 | 1.0 | 3 | 2.67 |
| Example 5 | 0.2 | 5 | 7.52 |
| Example 6 | 0.2 | 3 | 7.52 |
| Example 7 | 0.5 | 5 | 2.65 |

Experimental Example 1: Evaluation on Adhesion Strength of Conductive Pattern Minimum irradiation amounts of laser on the conductive patterns formed in above Examples 1 to 7 were measured, wherein the minimum irradiation amount of laser is the amount capable of satisfying class 0 to 1 based on the class of the ISO 2409 of delamination degree evaluation using a predetermined tape according to the ISO 2409 standard.

1. Class 0: a delamination area of a conductive pattern is 0% of an area of a conductive pattern to be evaluated.
2. Class 1: a delamination area of a conductive pattern is more than 0% to 5% or less of an area of a conductive pattern to be evaluated.

Laser condition to be used: Nd-YAG pulsed fiber laser (wavelength: 1064 nm, pulse frequency: 40 kHz)

Experimental Example 2: Evaluation of Resin Component on Mechanical Properties The impact strength of the resin components of above Examples 1 to 7 were measured according to the ASTM D256 standard, and then compared with those of polymeric resin substrates to which non-conductive metal compound particles were not blended (polycarbonate resin, PC) themselves.

The results of evaluating the adhesion strength and the mechanical properties are summarized in following Table 2:

TABLE 2

| | Minimum laser irradiation amount (W) | Impact strength (J/cm) |
|---|---|---|
| Example 1 | 10.0 | 6.2 |
| Example 2 | 7.0 | 5.9 |
| Example 3 | 7.0 | 6.8 |
| Example 4 | 10.0 | 7.1 |
| Example 5 | 4.3 | 6.5 |
| Example 6 | 7.0 | 7.2 |
| Example 7 | 7.0 | 6.8 |
| PC | — | 6.8 |

Referring to above Table 1, the composition of Examples 1 to 7 of the present application may easily satisfy the delamination degree of class 0 to 1 based on the class of the ISO 2409 with only a small amount of laser irradiation of about 10 W or less in the formation of a conductive pattern, and thus, it may be confirmed that the conductive pattern has excellent adhesion strength to the polycarbonate-based resin substrate.

Further, it may be confirmed that the resin component of the Examples of the present application maintains excellent impact strength equivalent to that of a general polycarbonate-based resin substrate such as a polycarbonate resin, in spite of the fact that non-conductive metal compound particles were blended, and a conductive pattern was formed under laser irradiation.

The invention claimed is:

1. A composition for forming a conductive pattern by electromagnetic wave irradiation, comprising:
   a polycarbonate-based resin; and
   particles of a non-conductive metal compound including a first metal element and a second metal element and having a spinel structure, wherein the particles have a particle diameter of 0.1 to 6 μm,
   wherein a metal nuclei including the first metal element, the second metal element, or an ion thereof is formed from the particles of the non-conductive metal compound by electromagnetic wave irradiation.

2. The composition of claim 1, wherein the particles of the non-conductive metal compound include at least one of non-conductive metal compounds represented by following of Chemical Formula 1, 2 or 3:

$$AB_2X_4 \qquad \text{[Chemical Formula 1]}$$

$$B(AB)X_4 \qquad \text{[Chemical Formula 2]}$$

$$[A_{(1-a)}M_{(a)}][B_{(2-b)}M_{(b)}]X_4 \qquad \text{[Chemical Formula 3]}$$

wherein:
   A and B are independently of each other the first and the second metal elements, and one of which is at least one metal selected from the group consisting of Cu, Ag, Pd, Au, Pt, Ni and Sn, and the other of which is at least one metal selected from the group consisting of Cr, Fe, Mo, Mn, Co and W;
   M is at least one metal selected from the group consisting of Cr, Fe, Mo, Mn, Co and W, and different from A or B;
   a is a real number more than 0 less than 1, and b is a real number more than 0 less than 2; and
   X is oxygen, nitrogen or sulfur.

3. The composition of claim 1, wherein the polycarbonate-based resin is a resin including a polycarbonate resin alone, or a resin including a polycarbonate resin and further, at least one resin selected from the group consisting of an ABS resin, an aromatic or aliphatic (meth)acrylate resin, a rubber modified vinyl-based graft copolymer resin, and a polyalkyene terephthalate resin.

4. The composition of claim 1, wherein the particles of the non-conductive metal compound are present in an amount of 0.1 to 7 wt %, based on the total composition.

5. The composition of claim 1, further comprising at least one additive selected from the group consisting of an inorganic filler, a colorant, a flame retardant, an impact reinforcing agent, and a functional reinforcing agent.

6. A method for forming a conductive pattern by direct electromagnetic wave irradiation, the method comprising:
   molding the composition for forming a conductive pattern of claim 1 into a resin product, or applying the composition to another product so as to form a resin layer;
   irradiating a predetermined region of the resin product or the resin layer with an electromagnetic wave, so as to generate a metal nuclei including a first metal element, a second metal element, or an ion thereof from the non-conductive metal compound particles; and
   chemically reducing or plating the region where the metal nuclei are generated, so as to form a conductive metal layer.

7. The method of claim 6, wherein the electromagnetic wave is a laser.

8. The method of claim 7, wherein the laser electromagnetic wave has a wavelength of 248 nm, 308 nm, 355 nm, 532 nm, 755 nm, 1064 nm, 1550 nm, or 2940 nm.

9. The method of claim 6, wherein as the generating of a metal nuclei proceeds, the particles of the non-conductive metal compound are partially exposed on a surface of a predetermined region of the resin product or the resin layer, and a metal nuclei is generated therefrom, thereby forming an adhesion-activated surface activated so as to have a higher adhesion property.

10. The method of claim 9, wherein the conductive metal layer is formed on the adhesion-activated surface by electroless plating.

11. A resin component having a conductive pattern, comprising:
   a polycarbonate-based resin substrate;
   particles of a non-conductive metal compound including a first metal element and a second metal element and having a spinel structure, wherein the particles have a particle diameter of 0.1 to 6 and are dispersed in the polycarbonate-based resin substrate;
   an adhesion-activated surface including a metal nuclei including a first metal element, a second metal element or an ion thereof exposed on a surface of a predetermined region of the polycarbonate-based resin substrate; and
   a conductive metal layer formed on the adhesion-activated surface.

12. The resin component of claim 11, wherein the predetermined region where the adhesion-activated surface and the conductive metal layer are formed corresponds to the region of the polycarbonate-based resin substrate irradiated with an electromagnetic wave.

13. The resin component of claim 11, wherein the conductive metal layer is formed on the polycarbonate-based resin substrate with adhesion strength of a delamination area of the metal layer being 0% (class 0), or more than 0% to 5% or less (class 1), of the area of the target metal layer to be tested, when tested according to the standard ISO 2409.

14. The resin component of claim 11, having impact strength of 4.0 J/cm or more as measured according to ASTM D256 standard.

15. The composition of claim 1, wherein the particles of the non-conductive metal compound have a specific surface area of about 0.5 to about 10 $m^2/g$.

* * * * *